United States Patent [19]

Voncken et al.

[11] Patent Number: 5,719,428

[45] Date of Patent: Feb. 17, 1998

[54] HIGH-FREQUENCY SEMICONDUCTOR DEVICE WITH PROTECTION DEVICE

[75] Inventors: Wilhelmus G. Voncken; Louis Praamsma, both of Nijmegen, Netherlands

[73] Assignee: U.S. Philips Corporation, New York, N.Y.

[21] Appl. No.: 656,994

[22] Filed: May 24, 1996

Related U.S. Application Data

[63] Continuation of Ser. No. 328,229, Oct. 25, 1994, abandoned.

[30] Foreign Application Priority Data

Oct. 27, 1993 [BE] Belgium ................. 09301145

[51] Int. Cl.$^6$ ................. H01L 23/62
[52] U.S. Cl. ............ 257/362; 257/355; 257/356; 257/361
[58] Field of Search ............... 257/361, 362, 257/408, 355, 356, 357, 360, 275, 661; 333/247, 246

[56] References Cited

U.S. PATENT DOCUMENTS

| | | | |
|---|---|---|---|
| 3,764,864 | 10/1973 | Okamura et al. | 257/362 |
| 4,720,737 | 1/1988 | Shirato | 257/362 |
| 5,225,896 | 7/1993 | Van Roozendaal et al. | 257/356 |
| 5,559,352 | 9/1996 | Hsue et al. | 257/355 |

FOREIGN PATENT DOCUMENTS

| | | |
|---|---|---|
| 0225586 | 6/1987 | European Pat. Off. . |
| 0381280 | 8/1990 | European Pat. Off. . |

OTHER PUBLICATIONS

"Silicon Processing for the VLSI Era", part 2, Process Integration, Lattice Press, California, pp. 441–446 by Wolf. no date.

*Primary Examiner*—Carl W. Whitehead
*Attorney, Agent, or Firm*—Brian J. Wieghaus; Steven R. Biren

[57] ABSTRACT

A semiconductor device with a semiconductor body (3) including a surface region (5) of a first conductivity type which adjoins a surface (4) and in which a field effect transistor (1) with insulated gate (6) is provided. The field effect transistor (1) has source and drain regions (7, 8, respectively) of the second, opposed conductivity type situated in the surface region (5), and a channel region (9) of the first conductivity type situated between the source and drain regions. A metal gate electrode (6) separated from the channel region (9) by an insulating layer (10) is provided over the channel region (9) and is provided with a protection device (2) against excessive voltages applied to the gate electrode (6). According to the invention, the surface (4) of the semiconductor body (3) is provided with a locally recessed field oxide (15), and the protection device (2) includes a lateral bipolar transistor with collector and emitter regions (16, 17, respectively) of the second conductivity type which are more strongly doped than the surface region (5) and which adjoin the surface (4) and the field oxide (15), and with a base region (18) of the first conductivity type which is more strongly doped than the surface region (5) and which lies below the field oxide (15), the collector region (16) being electrically connected to the gate electrode (6) and the emitter region (17) being electrically connected to the source region (7). It is achieved thereby that the field effect transistor (1) can switch high frequencies much more quickly.

5 Claims, 1 Drawing Sheet

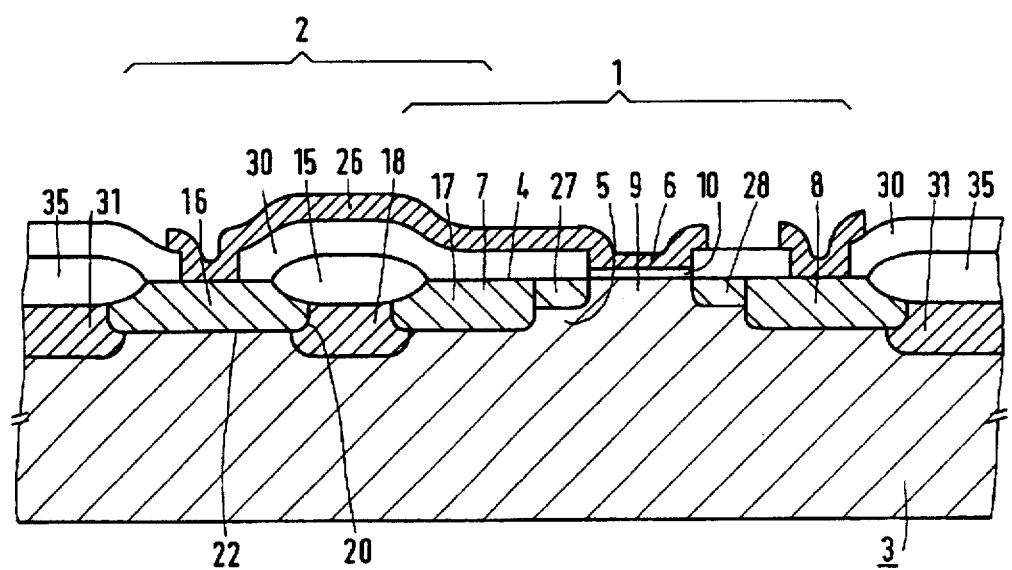

HIGH-FREQUENCY SEMICONDUCTOR DEVICE WITH PROTECTION DEVICE

This is a continuation of application Ser. No. 08/328,229, filed Oct. 25, 1994, now abandoned.

BACKGROUND OF THE INVENTION

The invention relates to a semiconductor device with a semiconductor body comprising a surface region of a first conductivity type which adjoins a surface and in which a field effect transistor with insulated gate is provided, with a source and a drain region of the second, opposed conductivity type in the surface region and a channel region of the first conductivity type situated between the source region and drain region, while a metal gate electrode situated above the channel region is separated from the channel region by an insulating layer and is provided with a protection device against excessive voltages provided with two pn junctions.

In such a semiconductor device, the gate electrode together with the channel region forms an input capacitance with the insulating layer as a dielectric. This input capacitance is charged or discharged during switching of the device. Owing to the use of a metal gate electrode with a low electrical resistance (R), charging or discharging of this capacitance (C) can take place very quickly. The device has a low so-called RC constant. Such a device, accordingly, is highly suitable for use at high frequencies above approximately 500 MHz. The protection device makes sure that high interference voltages applied to the gate electrode, which are practically unavoidable in practice, do not lead to a breakdown of the insulating layer.

U.S. Pat. No. 3,648,129 (FIGS. 5, 6 and 7) discloses a device of the kind mentioned in the opening paragraph in which the pn junctions in the protection device form a double diode connected back-to-back. The double diode comprises a first diode zone (7) of the second conductivity type adjoining the surface (11) and laterally surrounded by a second diode zone (6) of the first conductivity type, which also adjoins the surface. Adjoining the surface and fully surrounded by the first diode zone (7), there is a third diode zone (22) of the first conductivity type. For reference numerals, see FIG. 6 in U.S. Pat. No. 3,648,129. The double diode is formed by pn junctions between the first diode zone (7) on the one hand and the second and third diode zones (6, 22) on the other hand. The third diode zone (22) is connected to the gate electrode and the second diode zone (6) to the source electrode of the field effect transistor. A back-to-back double diode is thus formed which is situated between the gate electrode and the source of the field effect transistor. The double diode breaks down both at positive and at negative interference voltages on the gate, whereby charge is removed from the gate to the source. No high interference voltage is then present at the gate electrode.

The known device described has the drawback that the device cannot switch high frequencies sufficiently quickly.

SUMMARY OF THE INVENTION

The invention has for its object inter alia to obviate the said drawback.

According to the invention, the device is for this purpose characterized in that the surface of the semiconductor body is provided with a locally recessed field oxide, and the protection device comprises a lateral bipolar transistor with collector and emitter regions of the second conductivity type, with a higher doping level than the surface region, and adjoining the surface and the field oxide, and with a base region of the first conductivity type with a higher doping level than the surface region and situated below the field oxide, the collector region being electrically connected to the gate electrode and the emitter region being electrically connected to the source region.

It is achieved thereby, that the field effect transistor is capable of switching high frequencies much more quickly.

The invention is based on the recognition that the protection device in the known semiconductor device adversely affects the high-frequency characteristics of the field effect transistor. According to the invention, a protection device is chosen which is more suitable for high frequencies. Wolf, "Silicon Processing for the VLSI Era", part 2: Process Integration, Lattice Press, California, pp. 441–446, gives a summary of usual protection devices for field effect transistors in which effects such as diode breakdown, node-to-node punchthrough, field effect breakdown, and parasitic pnpn diode latchup are used. The suitability of such protection devices for high frequencies, however, is not discussed.

According to the invention, a lateral bipolar transistor is used in the protection device. Although this protection is not known from the cited book by Wolf, a protection device comprising a lateral transistor with a base region under field oxide is described in European Patent Application 225 586 A1. It is noted, however, in this Patent Application on page 7, second paragraph, that this protection is not satisfactory when it is used in transistors with an extremely high switching rate. It is surprisingly found that this protection nevertheless is satisfactory in practice at ultra high switching frequencies (UHF) of the field effect transistor.

The emitter region may be connected to the source region via a metal conductor track. In a preferred embodiment, the source region of the field effect transistor is at the same time the emitter region of the lateral transistor of the protection device. The protection device works faster then because the conductor track, which forms an additional resistance between the source region and the emitter region, is not present. The RC constant of the protection device itself becomes smaller. In addition, the protection device then occupies less space on the semiconductor surface.

Preferably, the device according to the invention is characterized in that the source and drain regions of the field effect transistor each comprise an extension region adjoining the channel region and the surface and having a doping level lower than the remainder of the source and drain regions, while an oxide layer provided with dopant atoms of the second conductivity type is present above the extension regions and above the field oxide, and a conductor track electrically connecting the collector region of the bipolar transistor to the gate of the field effect transistor is provided above the field oxide and the oxide layer. The device then comprises a transistor with a so-called quasi self-aligned metal gate structure. In such a structure, the channel region is formed in a self-aligned manner simultaneously with the extension regions of the source and drain regions. The gate electrode lies on the comparatively thick oxide layer on edges of the channel region, so that overlap capacitances between the metal gate electrode and source and drain regions are small and the transistor is accordingly highly suitable for high frequencies. The conductor track electrically connecting the collector region of the bipolar literal transistor to the gate of the field effect transistor is provided over the field oxide and the oxide layer. Owing to the comparatively thick dielectric layer formed by the field oxide and by the oxide layer, a capacitance between this conductor track and the surface region is very low, so that the device is even more suitable for high frequencies.

BRIEF DESCRIPTION OF THE DRAWING

The invention will be described in more detail below by way of example with reference to an embodiment and the annexed diagrammatic drawing, in which:

FIG. 1 is a cross-section of an embodiment of a semiconductor device according to the invention with a field effect transistor provided with a lateral bipolar transistor as a protection device.

DESCRIPTION OF THE PREFERRED EMBODIMENTS

The Figure is purely diagrammatic and not drawn to scale.

FIG. 1 is a cross-section of a semiconductor device with a semiconductor body 3 comprising a surface region 5 of a first conductivity type which adjoins a surface 4 and in which a field effect transistor 1 with insulated gate 6 is provided, with a source region 7 and a drain region 8 of the second, opposed conductivity type situated in the surface region 5, and a channel region 9 of the first conductivity type situated between the source region 7 and the drain region 8, while the metal gate electrode 6 situated above the channel region 9 is separated from the channel region 9 by an insulating layer 10 and is provided with a protection device 2 against excessive voltages with two pn junctions.

In such a device, the gate electrode 6 together with the channel region 9 forms an input capacitance with the insulating layer 10 as a dielectric. This input capacitance is charged or discharged during switching of the device. This capacitance can be charged very quickly owing to the use of a metal gate electrode 6, in this example made of aluminium, with a low electrical resistance. A gate electrode made from doped polycrystalline silicon provided with a metal silicide top layer, frequently used, is found to be not suitable in practice because the resistance in such a gate electrode is too high. With a metal gate electrode 6, the device has such a small RC constant that the device is particularly suitable for applications at high frequencies above approximately 500 MHz. The protection device 2 ensures that high interference voltages applied to the gate electrode 6, which are practically unavoidable in practice, will not lead to breakdown of the insulating layer 10.

A device of the kind mentioned in the opening paragraph is known in which the pn junctions in the protection device form a double diode connected back-to-back. The double diode comprises a pnp structure with an n-well provided in the surface and surrounded by a first p-type surface region, while a second p-type surface region is provided inside the n-well. The double diode is formed by pn junctions between the n-well on the one hand and the p-type surface regions on the other. In practice, the n-well is often differently doped from the source and drain regions of the field effect transistor. The first p-type region surrounding the n-well is connected to the source electrode, and the second p-type region inside the n-well is connected to the gate of the field effect transistor. A back-to-back double diode is thus formed situated between the gate electrode and the source of the field effect transistor. The double diode breaks down both with positive and with negative interference voltages applied to the gate electrode, charge being removed from the gate electrode to the source. No high interference voltage will be present at the gate then.

The known device has the drawback that the device cannot switch high frequencies sufficiently quickly.

In the device according to the invention, the surface 4 of the semiconductor body 3 is provided with a locally recessed field oxide 15 (LOCOS), and the protection device 2 comprises a lateral bipolar transistor with a collector region 16 and an emitter region 17 of the second conductivity type, more strongly doped than the surface region 5 and adjoining the surface 4 and the field oxide 15, and with a base region 18 of the first conductivity type more strongly doped than the surface region 5 and situated below the field oxide 15, the collector region 16 being electrically connected to the gate electrode 6 and the emitter region 17 being electrically connected to the source region 7. Such a semiconductor device can switch high frequencies much more quickly. In the protection device according to the invention, the same dopings can be used for the collector and emitter regions of the lateral transistor and for the source and drain regions of the field effect transistor. The doping of the base region of the lateral bipolar transistor may be adapted to the desired breakdown voltage of the bipolar transistor.

The invention is based on the recognition that the protection device 2 in the known semiconductor device forms a comparatively great capacitive load which increases the RC constant of the device. When the protection device in the known device is not switched on, the blocked pn junction between the second p-type surface region inside the n-well and the n-well itself forms a capacitance which is connected in parallel to the input capacitance of the field effect transistor formed by the gate electrode and the channel region. Since the n-well surrounds the second p-type region, and since the n-well and the second p-type surface region are comparatively strongly doped, this capacitance is comparatively great, so that the RC constant of the device increases. According to the invention, a protection device is chosen which is more suitable for high frequencies.

Usual protection devices for MOS transistors utilize effects such as diode breakdown, node-to-node punchthrough, field effect breakdown, and parasitic pnpn diode latchup. According to the invention, however, a lateral bipolar transistor is used in the protection device. Although this protection is known per se, it is also known that this protection is not satisfactory when used in transistors with an extremely high switching rate. It is surprisingly found that this protection nevertheless is satisfactory in practice at ultrahigh frequencies (UHF) of the field effect transistor. The capacitive load of the input capacitance formed by the gate electrode 6 and the channel region 9 in the protection device according to the invention is found to be very small. A suspected cause is that only the pn junction 20 between the collector region 16 and the base region 18 makes an appreciable contribution to the capacitance formed by the protection device. The pn junction 22 between collector region 16 and surface region 5 makes no appreciable contribution to the capacitance owing to the comparatively low doping level of the surface region 5.

In the preferred embodiment of FIG. 1, the source region 7 of the field effect transistor 1 is at the same time the emitter region 17 of the lateral transistor of the protection device 2. The protection device 2 operates more quickly then because a conductor track between the source region 7 and the emitter region 17, which would form an additional resistance, is not present. The RC constant of the protection device 2 itself becomes lower. Moreover, the protection device 2 now occupies less space on the semiconductor surface 4.

In FIG. 1, the device according to the invention comprises a field effect transistor with a source region 7 and a drain region 8, which comprise extension regions 27 and 28, respectively, adjoining the channel region 9 and the surface 4 with a doping lower than the remainder of the source region 7 and the drain region 8, while an oxide layer 30 provided with dopant atoms of the second conductivity type is present above the extension regions 27, 28 and the field oxide 15, a conductor track 26, which connects the collector region 16 of the bipolar transistor electrically to the gate electrode 6 of the field effect transistor 1, being provided above the field oxide 15 and the oxide layer 30. The device then contains a transistor with a so-called quasi-self-aligned metal gate structure. The channel region 9 is then formed in a self-aligned manner simultaneously with the extension regions 27, 28 of the source region 7 and the drain region 8. The gate electrode 6 is then situated on the comparatively thick oxide layer 30 on edges of the channel region 9, so that overlap capacitances between the metal gate electrode 6 and the source region 27 and the drain region 28 are small, and the transistor is accordingly highly suitable for high frequencies. The conductor track 26 electrically connecting the collector region 16 of the bipolar transistor to the gate electrode 6 of the field effect transistor 1 is provided over the field oxide 15 and the oxide layer 30. Owing to the comparatively thick dielectric layer formed by the field oxide 15 and the oxide layer 30, a capacitance between said conductor track 26 and the surface region 5 is very small, so that the device is even more suitable for high frequencies. The thickness of the field oxide 15 and of the oxide layer 30 provided with dopant atoms can be adapted, so that an optimum separation between the conductor track 26 and the surface region 5 may be chosen for a given geometry of the device. For lateral separation of transistors, locally recessed field oxide regions 35 provided with doped regions 31 below the field oxide, so-called channel stoppers, may be used in the semiconductor device. The doping of the channel stoppers 31 may be adapted, to the doping desired for the base region of the lateral bipolar protection transistor.

The device of FIG. 1 is manufactured as follows. Starting from a silicon semiconductor body 3 of the p⁻-type with a conductivity of 10 Ωcm, a LOCOS mask comprising a thin oxide and a nitride layer is provided in usual manner. The silicon surface 4 is first etched (0.4 µm deep) in openings of this mask, and subsequently channel stoppers 31 and the base region 18 are provided through implantation of B atoms with a doping of $3\times10^{15}$ cm$^{-2}$. Field oxide 15 and 35 is then grown in usual manner from hot steam to a thickness of 0.5 µm. The LOCOS mask is then removed. The surface is again oxidized into a masking oxide layer, after which openings for the collector region 16, the emitter region 17 and the source and drain regions 7 and 8 are provided in this masking oxide. Subsequently, $6\times10^{15}$ cm$^2$ P atoms are implanted through the openings and activated, so that an n⁺-type layer is created. The masking oxide is removed from the surface again. The surface 4 is subsequently provided with a 0.5 µm thick oxide layer 30 (SILOX) doped with P atoms, after which this oxide layer is removed above the channel region 9. Then the insulating layer 10, the gate oxide and the extension regions 27 and 28 are provided with an n-type doping through diffusion from the layer 30 by means of a temperature step in an oxidizing atmosphere. Contact holes for the connection of the collector region 16, the emitter/source region 17, 7, and the drain region 8 are then provided in the oxide layer 30. Subsequently, an aluminium conductor layer 26, 6 is provided and patterned. The semiconductor device is given a final mounting in an envelope in usual manner. Such a semiconductor device is suitable for frequencies to above 900 MHz.

Although certain techniques for the manufacture of the semiconductor device were used in the above description, such as, for example, ion implantation and SILOX deposition, it will be obvious that the use of alternative techniques, such as, for example, diffusion or deposition from TEOS (tetraethoxy silane) will not detract from the essence of the invention.

It will be apparent that the invention is not limited to the example described above, but that many modifications are possible within the scope of the invention. Thus, for example, a double field effect transistor, a so-called tetrode, may be used instead of a single field effect transistor 1. It is also possible to provide several field effect transistors provided with protection devices in a semiconductor body. It will be apparent to those skilled in the art that the doping concentrations in the emitter, base and collector regions of the lateral transistor of the protection device may be adapted to the desired voltage at which the lateral transistor switches itself on. Furthermore, materials other than those mentioned may be used. Thus the semiconductor body may be made, for example, from a III–IV compound.

We claim:

1. A uhf semiconductor device capable of operating at frequencies above 500 MHz and having a semiconductor body comprising a surface region of a first conductivity type which adjoins a surface and in which a field effect transistor with an insulated gate is provided, with a source and a drain region of the second, opposite conductivity type in the surface region and a channel region of the first conductivity type situated between the source region and drain region, and a metal gate electrode situated above the channel region, separated from the channel region by an insulating layer and provided with a protection device for protecting against excessive voltages comprising two pn junctions, wherein the surface of the semiconductor body is provided with a locally recessed field oxide, and the protection device comprises a lateral bipolar transistor with collector and emitter regions of the second conductivity type with a higher doping level than that of the surface region, and adjoining the surface and the field oxide, and with a base region of the first conductivity type with a higher doping level than that of the surface region and situated below the field oxide, the collector region being electrically connected to the gate electrode and the emitter region being integrally formed with the source region.

2. A semiconductor device as claimed in claim 1, characterized in that the source and drain regions of the field effect transistor each comprise an extension region adjoining the channel region and the surface and having a doping level lower than a remaining portion of the source and drain regions, an oxide layer provided with dopant atoms of the second conductivity type being present above the extension regions and above the field oxide, and a conductor track electrically connecting the collector region of the bipolar transistor to the gate of the field effect transistor is provided above the field oxide and the oxide layer.

3. A semiconductor device including over-voltage protection and operable at ultra high frequencies, said semiconductor device including:

a semiconductor body having a surface region of a first conductivity type and an adjoining surface;

a field effect transistor in said semiconductor body, said field effect transistor comprising a source and a drain region, each of a second conductivity type opposite to said first conductivity type, in said surface region, a channel region of the first conductivity type situated between said source region and said drain region, a metal gate electrode situated above the channel region, and an insulating layer separating said channel region from said gate electrode; and a protection device for protecting said field effect transistor against excessive voltage, said protection device comprising said surface of said semiconductor body having a locally recessed field oxide, a lateral bipolar transistor, the lateral bipolar transistor comprising (i) collector and emitter regions of said second conductivity type with a higher doping level than that of the surface region and adjoining said surface and said locally recessed field oxide and (ii) a base region of the first conductivity type with a higher doping level than that of said surface region and situated between said locally recessed field oxide and said surface region, and a metal conductor track directly contacting said collector region and said metal gate electrode to electrically connect the collector region to the gate electrode, and said emitter region being integral with said source region, and said field effect transistor and said protection device being operable at frequencies of at least as high as 500 MHz.

4. A semiconductor device as claimed in claim 3, characterized in that the source and drain regions of the field effect transistor each comprise an extension region adjoining the channel region and the surface and having a doping level lower than the remainder of the source and drain regions, while an oxide layer provided with dopant atoms of the second conductivity type is present above the extension regions and above the field oxide, and a conductor track electrically connecting the collector region of the bipolar transistor to the gate of the field effect transistor is provided above the field oxide and the oxide layer.

5. A semiconductor device according to claim 4, wherein said metal conductor track and said metal gate consist of one continuous strip of metal.

* * * * *